United States Patent [19]

Banting

[11] Patent Number: 5,497,096

[45] Date of Patent: Mar. 5, 1996

[54] FAULTED CIRCUIT INDICTOR WITH THREE-DIMENSIONAL DISPLAY DEVICE

[75] Inventor: John F. Banting, Waukesha, Wis.

[73] Assignee: Cooper Industries, Inc., Houston, Tex.

[21] Appl. No.: 87,447

[22] Filed: Jul. 2, 1993

[51] Int. Cl.$^6$ .................................................. H01H 31/02
[52] U.S. Cl. ........................ 324/555; 324/543; 340/664; 340/815.63
[58] Field of Search .................................... 324/522, 543, 324/555, 556, 133; 340/638, 664, 815.85, 815.71, 815.64, 815.62, 815.63; 361/93, 115

[56] References Cited

U.S. PATENT DOCUMENTS

| | | | |
|---|---|---|---|
| 3,025,512 | 3/1962 | Bloechl | 340/815.86 |
| 3,364,481 | 6/1965 | Fuzzell | 340/815.63 |
| 3,460,038 | 12/1965 | Ziegler | 324/146 |
| 3,816,816 | 6/1974 | Schweitzer, Jr. | 324/133 |
| 3,995,243 | 11/1976 | Malmborg | 335/253 |
| 4,157,520 | 6/1979 | Moates et al. | 335/230 |
| 4,466,042 | 8/1984 | Zylstra et al. | 361/115 |
| 4,495,489 | 1/1985 | Schweitzer, Jr. | 340/664 |
| 4,661,813 | 4/1987 | Mazzamauro et al. | 340/815 |
| 4,694,599 | 9/1987 | Hart et al. | 40/449 |
| 5,159,319 | 10/1992 | Dunk et al. | 340/646 |
| 5,220,311 | 6/1993 | Schweitzer, Jr. | 324/133 |

*Primary Examiner*—Kenneth A. Wieder
*Assistant Examiner*—Christopher M. Tobin
*Attorney, Agent, or Firm*—Conley, Rose & Tayon

[57] ABSTRACT

A faulted circuit indicator with a high visibility spherical display device is disclosed for indicating a fault condition disposed within the display apparatus is a permanent magnet 42 that is in magnetic communication with, and actuated by, an electromagnet. The permanent magnet is rotatably mounted within the display and is attached to a spherical flag. The spherical flag has two different colors at its hemisphere to represent fault and no-fault conditions. The electromagnet comprises a magnetic core and coil assembly and is magnetized by a current pulse received from the indicator circuitry. By changing the direction of the current through the coil assembly, the polarity of the electromagnet is reversed, which in turn causes the permanent magnet to rotate 180° to realign with the poles of the electromagnet. Because the flag is colored about its hemisphere, the rotation of the permanent magnet results in a change of color being displayed in the display device.

38 Claims, 7 Drawing Sheets

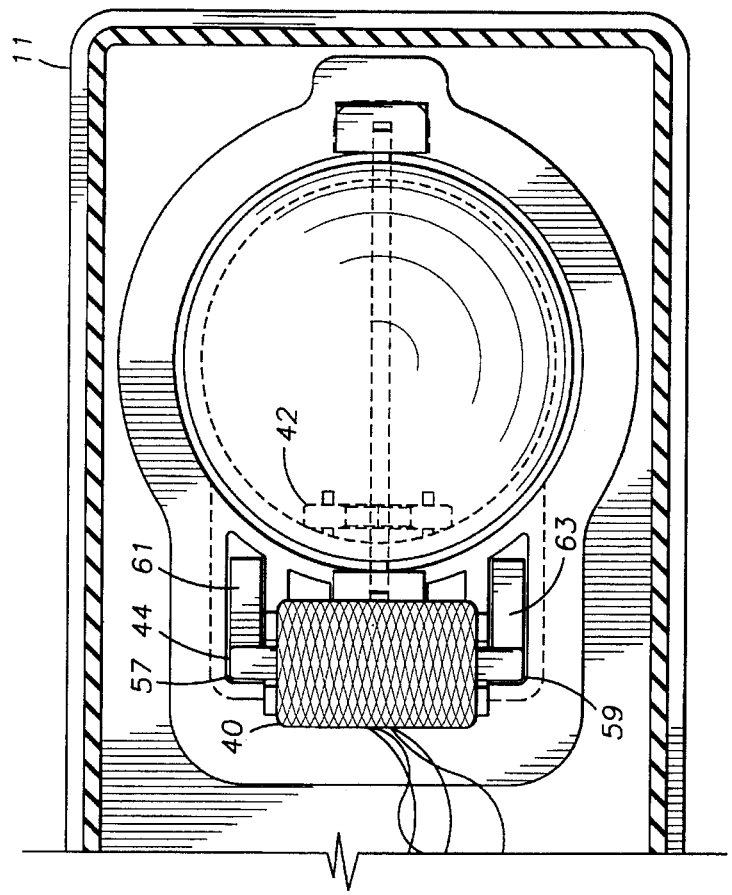
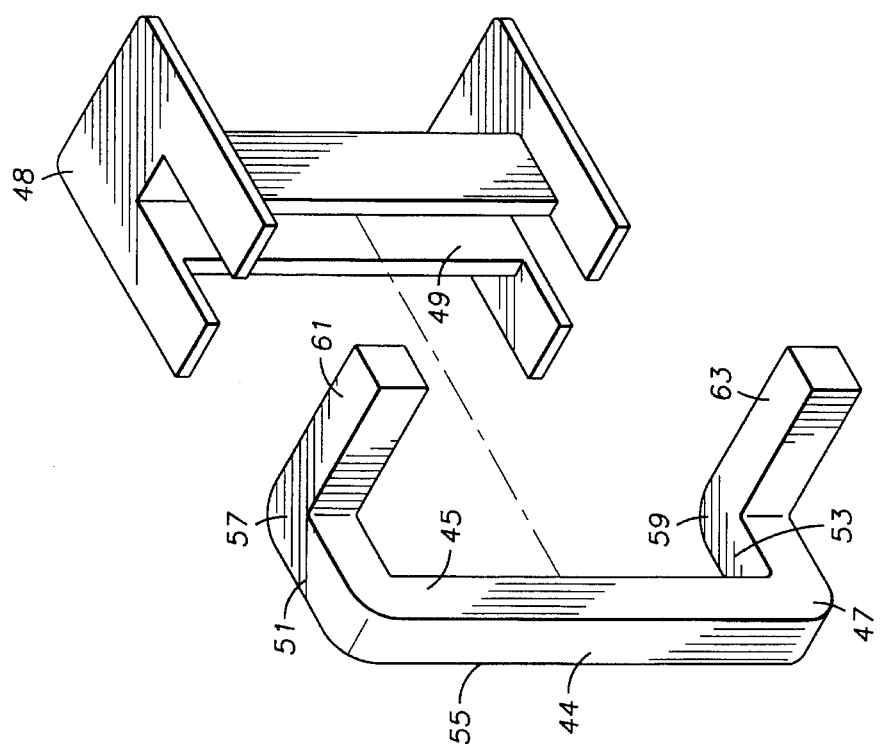
FIG. 5
FIG. 4

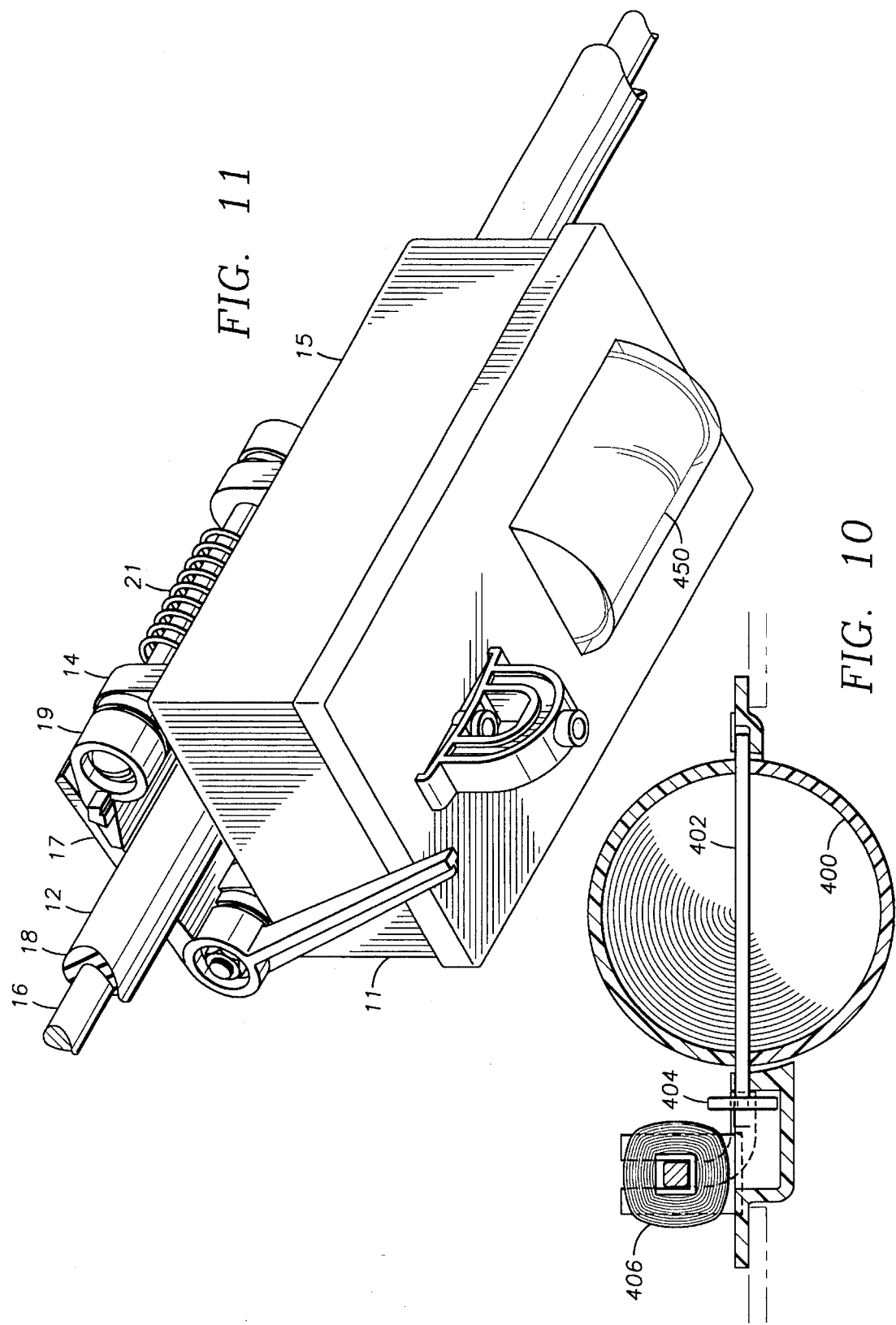

FAULTED CIRCUIT INDICTOR WITH THREE-DIMENSIONAL DISPLAY DEVICE

TECHNICAL FIELD OF THE INVENTION

The present invention relates to faulted circuit indicators and, more particularly, to displays for faulted circuit indicators.

BACKGROUND OF THE INVENTION

Various types of faulted circuit indicators ("FCI's") are well known in the industry. These devices are typically used to sense and detect electrical faults in overhead conductors. Examples of different FCI's include clamp-on type faulted indicators that clamp directly on the overhead conductor and test point type fault indicators that are strategically placed at certain test points on the conductor.

Many FCI's include a binary display device for indicating the presence of a normal/reset or fault condition in the overhead conductor. The display devices of most FCI's are actuated by an electromagnetic field that causes an indicator flag to rotate either 90 or 180 degrees. Because each side of the flag is colored or marked differently, the color or mark displayed on the indicator changes when the flag rotates or flips. A change in the color or mark of the indicator flag signals that a fault condition exists. Such indicators can be either manually reset after the fault condition disappears or electrically reset upon restoration of current in the overhead conductor. U.S. Pat. Nos. 3,460,038, 3,995,243, 4,157,520, 4,466,042, 4,495,489, 4,661,813, 4,694,599 and 5,159,319 provide a representative overview of some faulted circuit indicators of this type.

U.S. Pat. No. 4,495,489 teaches a FCI for indicating the occurrence of a fault in a power distribution system with a rotatably mounted indicator flag. The indicator flag is actuated through successive 90 degree trip and reset positions by an electromagnetic device and is visible through a pair of viewing windows located on the face of the FCI's housing. Similarly, U.S. Pat. No. 4,694,599 discloses an electromagnetic indicator capable of indicating a normal/reset or fault condition. The display device disclosed in that invention is a rotatably mounted semicircular flag assembly which rotates between trip and reset positions.

The displays of the FCI's presently on the market, such as those described above, are extremely difficult to view, particularly when mounted on overhead electric utility conductors. The indicators or display devices of these FCI's are usually configured in the traditional, two-dimensional flag-type shape. Under ideal conditions, therefore, the old FCI's require utility linemen to position themselves directly below the display device in order to ascertain the status of the display. Under less favorable conditions, the linemen must sometimes use binoculars to view the display device. This visibility problem hinders the ability of linemen to readily view the indicator of the display device to ascertain the status of the conductor and can often result in erroneous readings.

In an attempt to alleviate the above problem, some FCI manufacturers have added a battery and a flashing L.E.D. to increase the visibility of the display device. This approach, however, has proved inadequate for various reasons (e.g. batteries have been unacceptable to many utilities). Other attempts to enhance visibility through improved display designs have been equally unsuccessful.

SUMMARY OF THE INVENTION

The present invention comprises a faulted circuit indicator ("FCI") that attaches to an overhead conductor via a clamping mechanism, which holds the FCI firmly in place. Disposed within the housing of the FCI is a current transformer, a trip circuit, a reset circuit, and an electromagnet. Additionally, a permanent magnet is disposed within a spherical display that is rotatably-mounted on the cover of the housing. The spherical display rotates in 180 degree intervals to indicate the status or condition of the overhead conductor.

The current transformer of the present invention constantly monitors the current in the overhead conductor, which may be part of a larger electrical distribution system. In accordance with conventional techniques, the current transformer supplies the reset circuit and trip circuit with operating power at the input terminals. The reset circuit and trip circuit, which are mounted on a circuit board within the housing, electrically connect to the electromagnet that preferably includes a trip coil, a reset coil and a magnetic core having two poles of opposite polarity. During the no-fault condition, the reset circuit periodically energizes the reset coil with an electrical pulse that magnetizes the poles on the electromagnet's magnetic core. Similarly, when a fault condition arises in the overhead conductor, the trip circuit induces a pulse in the trip coil, causing the polarities of the poles on the magnetic core to be reversed.

Like the magnetic core of the electromagnet, the permanent magnet has two poles of alternating polarity. The permanent magnet is disposed within the spherical display so that it is magnetically coupled to the electromagnet. Accordingly, the poles of the permanent magnet are positioned adjacent to, and aligned with, the opposite polarity poles on the magnetic core of the electromagnet, i.e., the positive pole of the electromagnet aligns with the negative pole of the permanent magnet and vice-versa.

Each hemisphere of the spherical display is supported on a horizontal axis shaft parallel to the overhead conductor and the ends of the axis shaft are rotatably mounted on the face of the FCI's housing. This design dictates that only one hemisphere of the display will be exposed, while the other hemisphere will remain disposed within the housing. The permanent magnet is also affixed to, and supported by, the axis shaft of the spherical display. Accordingly, the permanent magnet is rotatably coupled to the spherical display via the axis shaft. In operation, therefore, the rotation of the permanent magnet caused by the magnetic field of the electromagnet will actuate the rotation of the spherical display.

The spherical display is painted with a nonmagnetic reflective coating, one half being a bright color, typically orange, and the other half a dull color, typically black. Each color indicates a different condition in the overhead conductor. The black hemisphere of the display is exposed when the conductor is in its normal or unfaulted state. The orange hemisphere of the display, on the other hand, is exposed when the conductor has operated in its fault or tripped state.

During normal operating conditions, the pulse induced in the reset coil magnetizes the poles on the electromagnet's magnetic core so that the black hemisphere of the display is outwardly exposed due to the magnetic coupling of the electromagnet with the permanent magnet. When a fault condition occurs, however, the trip circuit induces a pulse in the trip coil, causing the polarities of the poles on the magnetic core to be reversed. When the polarities are reversed, the previously aligned poles of the electromagnet and the permanent magnet will oppose, causing the sphere to rotate 180 degrees so that the orange hemisphere of the display is now exposed and the poles of the permanent magnet are again aligned with the opposite polarity poles of the electromagnet. Similarly, when normal operating conditions are restored in the overhead conductor, the reset coil is energized by the reset circuit and the poles of the magnetic core are once again reversed. Consequently, the spherical display device rotates 180 degrees and assumes its reset indicating status.

The present invention offers a marked improvement in viewing the display device. Because the spherical display is three-dimensional, the display protrudes from the face of the FCI's housing, thus providing an easy viewing target. The reflective coating of the display and the drastic color contrast in the hemispheres further enhances the visibility of the spherical display. In sum, the shape of the sphere, its unique coloring, and its position in relation to the housing all combine to make the display device highly visible from all angles. This 360 degree visibility enables linemen to more easily and more accurately read the display's status. Accordingly, erroneous readings may be all but eliminated.

In addition to the substantial improvement with respect to visibility, the unique circuitry of the present invention requires very little energy to operate. This is accomplished by using a voltage multiplier network to boost the voltage produced by the current transformer at the input terminals. Operation under low power is particularly advantageous for FCI's because very little energy is available.

Yet another advantage of the present invention is its low manufacturing costs. Furthermore, the intrinsic simplicity of the invention will result in lower maintenance costs. Still other objects and advantages of the invention will appear from the following description.

BRIEF DESCRIPTION OF THE DRAWINGS

For a detailed description of a preferred embodiment of the invention, reference will now be made to the accompanying drawings wherein:

FIG. 4 is a perspective view of the magnetic core and bobbin of the electromagnet shown in FIG. 2.

FIG. 5 is a cross-sectional view along plane 5—5 of FIG. 2 depicting the display apparatus and electromagnet of the faulted circuit indicator.

FIG. 10 is a side view of an alternative embodiment of a faulted circuit indicator with a permanent magnet external to the display device.

FIG. 11 is a perspective view of an alternative embodiment of the faulted circuit indicator of the present invention with a cylindrical display.

DETAILED DESCRIPTION OF THE PREFERRED EMBODIMENT

Figure 1:
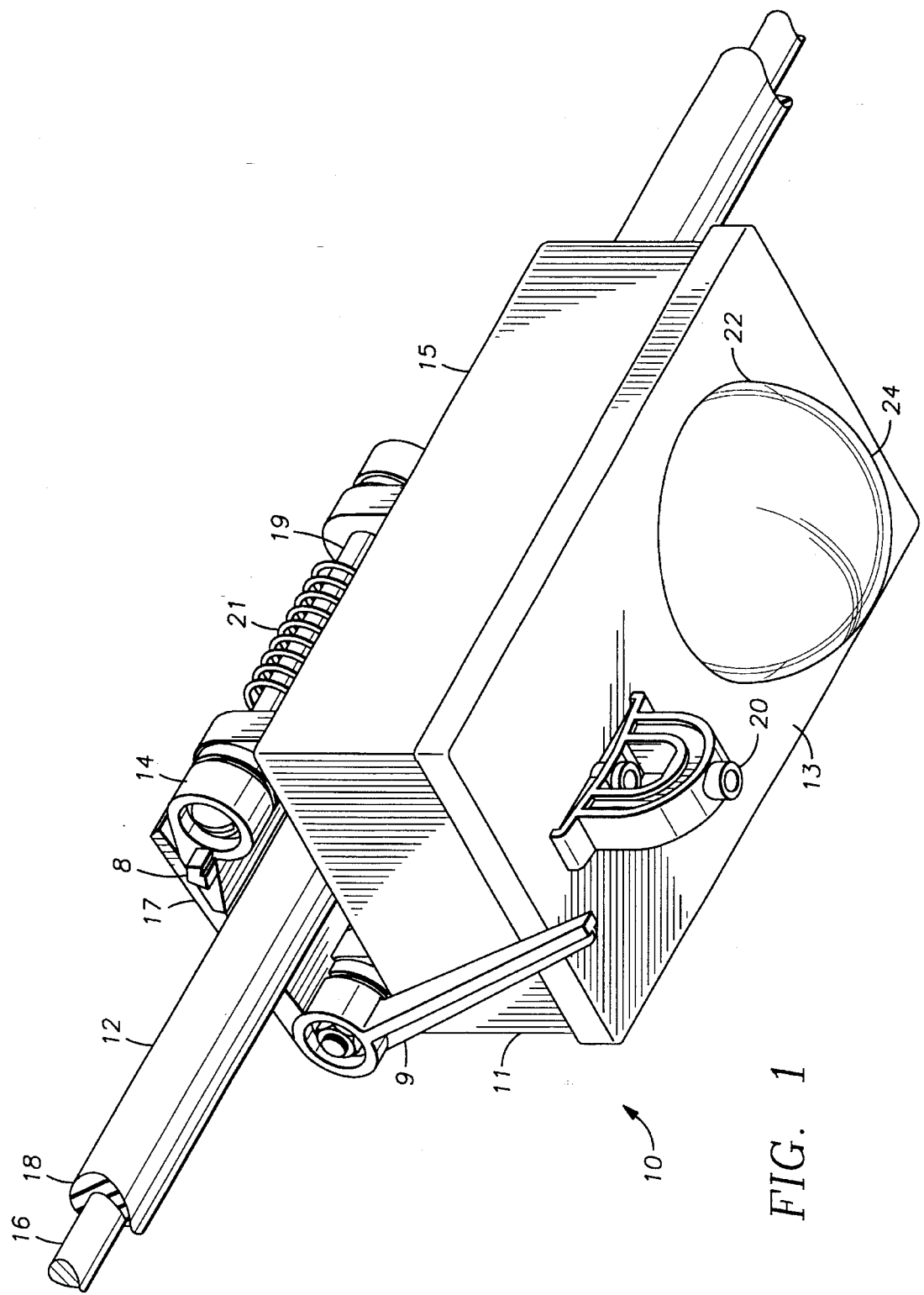
FIG. 1 is a perspective view of a faulted circuit indicator constructed in accordance with the preferred embodiment of the present invention and mounted on an overhead conductor.

Referring initially to FIG. 1, there is depicted a faulted circuit indicator 10 constructed in accordance with the preferred embodiment of the present invention. The faulted circuit indicator 10 is adapted for attachment to an overhead conductor 12 by spring clamp 14 or by any other suitable mechanism. The overhead conductor 12 may be part of an electrical distribution system and includes a central conductor 16 encapsulated by an electrically insulative coating 18. The dimensions of overhead conductors vary according to electrical capacity which are well known in the art. In general, overhead conductor 12 may carry currents ranging from less than one amp up to six hundred amps under normal operation. Faulted circuit indicator 10 includes circuitry that has variable trip ranges which are adjustable.

The housing 11 of the preferred embodiment is rectangular and constructed of a fiberglass reinforced plastic material, which is electrically insulated. One skilled in the art, however, will recognize that different housing shapes and materials may be used in conjunction with this invention. Housing 11 is mounted on overhead conductor 12 by spring clamp 14, which is affixed to the back panel 15 of housing 11. Spring clamp 14 utilizes spring loaded arms 17 mounted on pivot pins 19 that clamp down over conductor 12 by means of spring 21. The tension in the spring 21 holds the arms 17 firmly in place and ensures a secure attachment of indicator 10 to overhead conductor 12. One skilled in the art will recognize that other clamping mechanisms, such as the one disclosed in U.S. Patent application Ser. No. 07/951,148 filed Sep. 25, 1992 and entitled "Releasable Sensor for Faulted Circuit Detector" may be equally effective.

To facilitate actual installation of the faulted circuit indicator 10 on overhead conductor 12, a closed-loop hook member 20 preferably is positioned on the cover 13 of housing 11. Hook member 20 is adapted to receive a hot stick (not shown) that is used for mounting purposes. During installation, the spring clamp 14, with its arms 17 in an open position, is guided by a hot stick directly under overhead conductor 12. Spring clamp 14 includes a locking mechanism 8 which receives a cross bar actuator 9. As spring clamp 14 is forced against overhead conductor 12, the conductor 12 engages and releases cross bar 9 from locking mechanism 8, thus releasing the arms 17. The arms 17 are then spring actuated about pivot pin 19 to engage and grip the conductor 12 with sufficient force to maintain the faulted circuit indicator 10 in the installed position depicted in FIG. 1. Similarly, faulted circuit indicator 10 may be removed from overhead conductor 12 by attaching the hot stick to hook member 20 and forcing arms 17 to open as housing 11 is pulled away from the conductor 12.

A spherical display 22, shown here in its no-fault, reset state, comprises the display device of faulted circuit indicator 10. The position of spherical display 22 in relation to housing 11 is such that one hemisphere of display 22 projects from the cover 13 of housing 11 with the exposed, projecting hemisphere capable of being viewed from the ground. A clear, transparent dome 24, which may assume any shape or form that does not interfere with the rotation of spherical display 22, protects the visible half of spherical display 22. Dome 24 is constructed of a clear glass or plastic and is attached to the face 13 of housing 11 such as by ultrasonic welding or any other means well known in the art. The transparent nature of dome 24 allows the exposed hemisphere of the display 22 to be visible even though the line of sight is parallel to the planar surface of cover 13 of housing 11. Furthermore, dome 24 protects spherical display 22 from any interference or contamination and corrosion caused by the outside environment. Thus, dome 24 provides protection against the elements, while also enhancing the visibility of spherical display 22 so that a lineman can more readily ascertain the status of overhead conductor 12.

Figure 2:
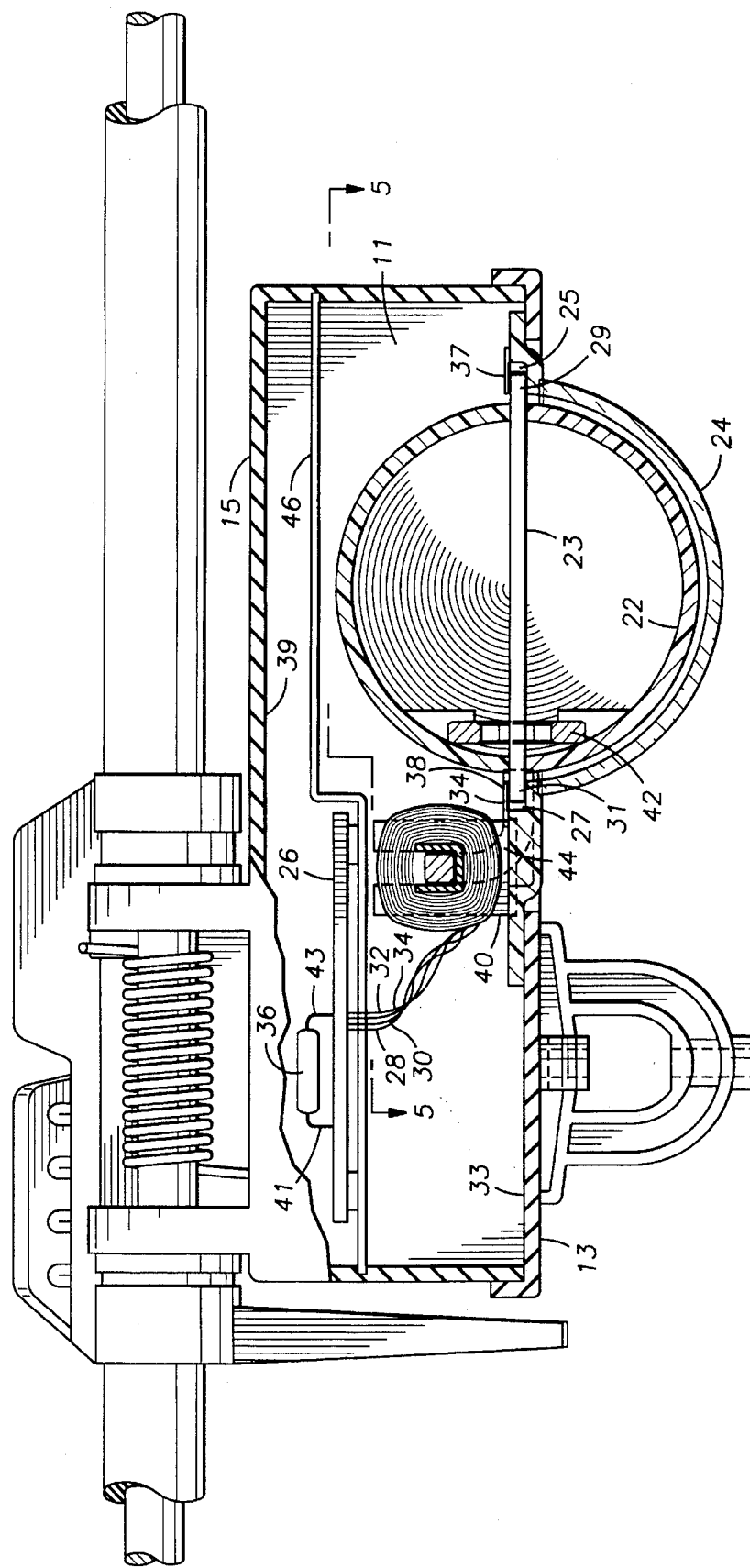
FIG. 2 is a cross-sectional view illustrating the internal construction of the faulted circuit indicator of FIG. 1.

Referring now to FIG. 2, the internal construction of the faulted circuit indicator 10 is shown. A current transformer 36 constantly monitors and senses the current in overhead conductor 12 in order to detect the occurrence of a fault current. Current transformer 36 preferably is mounted adjacent the inner surface 39 of back panel 15 of housing 11 in order to ensure maximum detection of the current passing through the overhead conductor 12. A shield 46 is disposed between the back panel 15 of housing 11 and an electromagnet 40 to insulate the electromagnet 40 and a permanent magnet 42 disposed within the spherical display 22 from the magnetic field produced by conductor 12. Shield 46 preferably is constructed of a mu metal material that is highly effective in preventing any magnetic field interference that might erroneously affect the operation of spherical display 22.

Within housing 11, the principal electrical components of the indicator circuitry are mounted on a circuit board 26. Wires 41 and 43 electrically connect the indicator circuitry on circuit board 26 to current transformer 36, which supplies the indicator circuitry with an input electrical signal. Four wires 28, 30, 32, and 34 extend from circuit board 26 to electrically connect the indicator circuitry mounted on circuit board 26 to the reset coil and trip coil, shown in FIG. 3, of electromagnet 40. The inner surface 33 of face 13 preferably supports a molded piece (not shown) of plastic forming a channel to receive and support electromagnet 40. Electromagnet 40 is strategically mounted in the housing 11 of faulted circuit indicator 10 such that the poles of permanent magnet 42 are in close magnetic communication with the poles of electromagnet 40.

Figure 3:
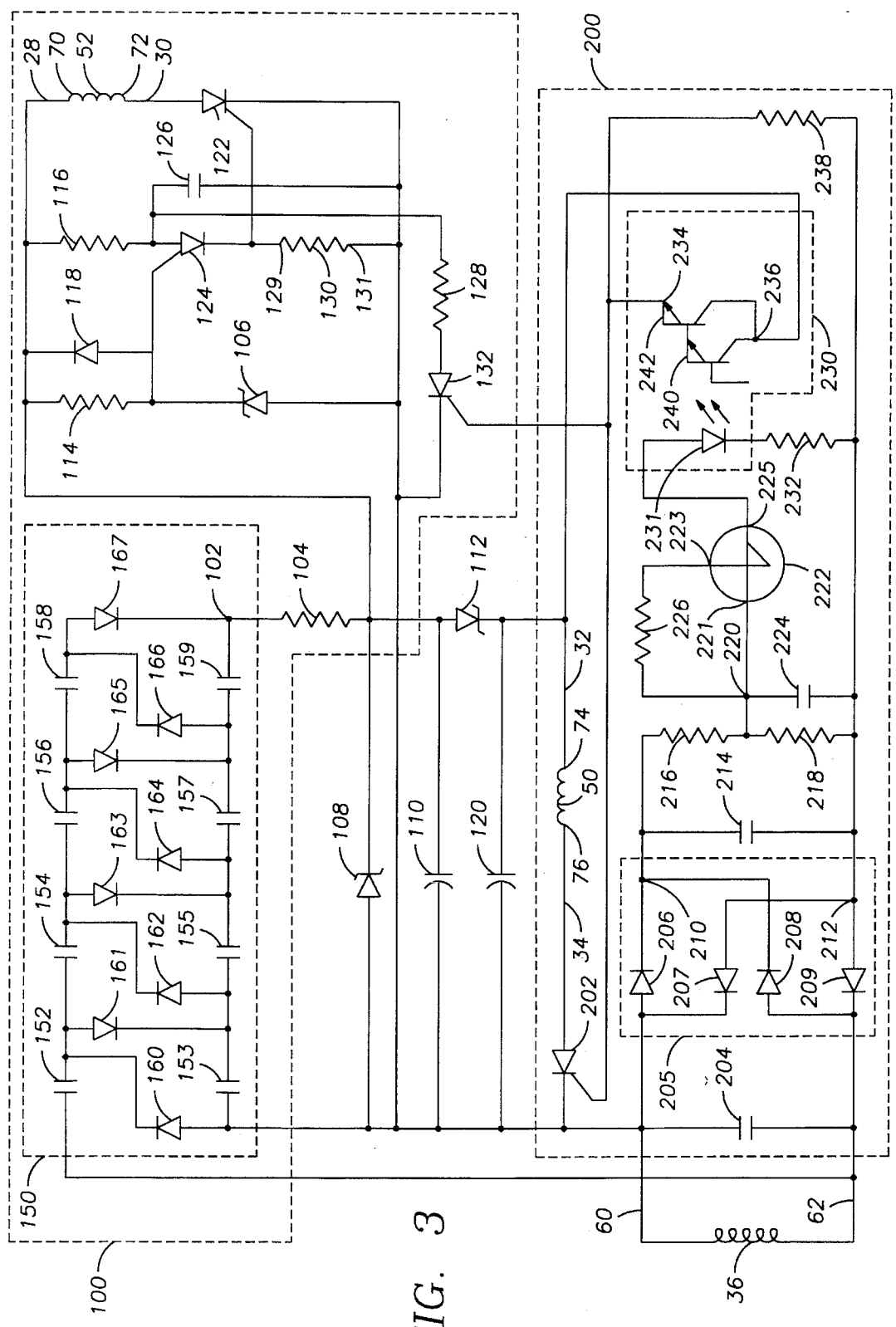
FIG. 3 is an electrical schematic diagram of the circuitry of the faulted circuit indicator of FIGS. 1 and 2.

Referring now to FIG. 3, the primary electrical components of faulted circuit indicator 10 are schematically diagrammed. All the electrical components depicted in FIG. 3, with the exception of trip coil 50 and reset coil 52, are mounted on circuit board 26, shown in FIG. 2. As described above, reset coil 52 connects to circuit board 26 via wires 28 and 30, and trip coil 50 connects to circuit board 26 through wires 32 and 34. One skilled in the art will recognize that other circuitry may utilize one bi-directional coil, instead of separate trip and reset coils.

The circuit illustrated in FIG. 3 primarily comprises a reset circuit 100 and a trip circuit 200. Reset circuit 100 periodically energizes reset coil 52 when overhead conductor 12 is in an unexcited or no-fault state i.e. when the current in overhead conductor 12 is less than the trip value setting of faulted circuit indicator 10. Trip circuit 200, on the other hand, will energize trip coil 50 upon the occurrence of a fault condition in overhead conductor 12. A fault condition typically arises when the current in overhead conductor 12 exceeds four hundred amps. However, one skilled in the art will recognize that different circuits may be rated to detect various fault condition ranges.

The current transformer 36 connects to the reset circuit 100 through the input terminals 60 and 62. Input terminal 60 is connected to a voltage multiplier 150, consisting of a plurality of capacitors 152–159 and diodes 160–167, through the anode of diode 160 and one terminal of capacitor 153. Input terminal 62 is connected to voltage multiplier 150 through one terminal of capacitor 152. The output terminal node 102 of voltage multiplier 150 connects to the cathode of diode 167 and one terminal of capacitor 159.

A resistor 104 connects the rest of the reset circuit 100 to the output terminal node 102 of voltage multiplier 150. Resistor 104 connects to the cathode of a zener diode 108, the positive polarity terminal of capacitor 110, the anode of a zener diode 112, and one terminal 70 of reset coil 52. Terminal 70 of reset coil 52, in turn, connects to two resistors 114 and 116 and the cathode of diode 118.

One of the principal components of reset circuit 100 is a programmable unijunction transistor 124, commonly known as a PUT. The anode of PUT 124 connects to resistor 116, one terminal of capacitor 126, and a resistor 128, while the gate of PUT 124 connects to the anode of diode 118, the cathode of zener diode 106, and resistor 114. The cathode of PUT 124 connects to the gate of silicon-controlled rectifier ("SCR") 122 and one terminal 129 of resistor 130. The other terminal 131 of resistor 130, in turn, connects to one terminal of capacitor 126, the anode of zener diode 106, and the cathodes of SCR 132 and SCR 122. The anode of SCR 122 connects to one terminal 72 of reset coil 52 through wire 30 and the anode of SCR 132 connects to resistor 128.

The current transformer 36 also connects to the trip circuit 200 through input terminals 60 and 62. The input terminals 60 and 62 connect to a network consisting of a capacitor 204 and a diode bridge 205, comprising diodes 206-09. Additionally, input terminal 60 connects to the cathode of SCR 202. The output terminals 210 and 212 of diode bridge 205 connect across a capacitor 214 and a voltage divider network comprising resistor 216 and resistor 218. The output terminal node 220 of this network connects to silicon unilateral switch ("SUS") 222 through its anode terminal 221, a resistor 226, and one terminal of capacitor 224. The gate terminal 223 of SUS 222 connects to resistor 226 and the cathode terminal 225 of SUS 222 connects to the anode of a photo-diode 231 of an optocoupler 230, comprising a pair of Darlington transistors 240 and 242 and the photo-diode 231.

One output gate terminal 236 of optocoupler 230 connects to the positive polarity terminal of capacitor 120, the cathode of zener diode 112, and one terminal 74 of trip coil 50 through wire 32. The other output gate terminal 234 of optocoupler 230 connects to one terminal of resistor 238 and the gates of SCR 132 and SCR 202. The other terminal of resistor 238 connects to one terminal of capacitor 224 and a resistor 232, which is connected to the cathode of the photo-diode 231 of SUS 222. The anode of SCR 202 connects to one terminal 76 of trip coil 50 through wire 34.

In operation, the current transformer 36, in accordance with conventional techniques, induces an alternating current in the windings of current transformer 36 that is proportional to the current flowing in the overhead conductor 12. This induced current is applied to input terminals 60 and 62, producing a voltage differential across terminals 60 and 62. The current transformer 36 preferably is located in close proximity to overhead conductor 12 in order to ensure maximum operation.

Under normal, no-fault conditions, a portion of the voltage appearing at input terminals 60 and 62 will travel through the four-stage voltage multiplier 150, consisting of a plurality of capacitors 152–159 and diodes 160–167. The network arrangement of voltage multiplier 150 rectifies and increases the voltage from input terminals 60 and 62. The purpose of voltage multiplier 150, therefore, is two-fold. First, it rectifies the input current at terminals 60 and 62, resulting in a pulsating unidirectional current at the network's output terminal node 102. Second, voltage multiplier 150 takes the voltage appearing at input terminals 60 and 62 and produces an increased voltage at its output terminal node 102. This voltage boost permits reset circuit 100 to operate under very low power conditions. Accordingly, current transformer 36 need only draw nanoamps of current from overhead conductor 12 in order to supply input terminals 60 and 62 with sufficient power to operate reset circuit 100.

The voltage produced by voltage multiplier 150 appears across resistor 104. The primary function of resistor 104 is to limit the amount of current flow throughout the rest of reset circuit 100. A zener diode 108 regulates the maximum voltage across resistor 104. A portion of the voltage at resistor 104 produced by voltage multiplier 150 will directly charge capacitor 110 and indirectly charge a second capacitor 120 through zener diode 112. Zener diode 108 protects capacitors 110 and 120 from receiving potentially destructive over-voltages.

The voltage appearing at resistor 104 produced by voltage multiplier 150 will appear at resistors 114 and 116 and will charge capacitor 126. This voltage will also appear at one terminal 70 of reset coil 52 through wire 28. However, reset coil 52 will not receive any current at this time because silicon-controlled rectifier ("SCR") 122 has not yet been actuated. Similarly, the voltage across capacitor 120 will appear at one terminal 74 of trip coil 50 through wire 32. Like reset coil 52, however, trip coil 50 will not receive any current at this time because silicon-controlled rectifier ("SCR") 202 has not yet been actuated by trip circuit 200.

Programmable unijunction transistor 124 is one of the principal components of reset circuit 100. Resistor 114 and zener diode 106 establish a bias voltage to the gate of PUT 124. Similarly, resistor 116 and capacitor 126 establish a bias voltage for the anode of PUT 124. Resistor 130 provides gate stabilization for SCR 122 and a discharge path for the cathode of PUT 124. Diode 118, meanwhile, provides temperature stabilization to maintain accurate switch points over the temperature range of −40° C. to +85° C.

As the voltage from voltage multiplier 150 gradually increases at resistor 116, a bias voltage appears at the anode of PUT 124. Likewise, resistor 114 supplies a bias voltage at the gate of PUT 124. During the voltage increase, zener diode 106, which is specifically selected due to its extremely low leakage current during operation, will eventually begin to leak current when the voltage at the cathode of zener diode 106 nears its regulated voltage. When zener diode 106 starts to leak, the increase of the voltage level at the cathode of zener diode 106 will slow. The voltage at the resistor 116, however, will continue to rise. Eventually, therefore, the voltage at the anode of PUT 124 will exceed the voltage on the gate of PUT 124. When this voltage differential is reached, PUT 124 will trigger.

At this point, capacitor 126 will discharge through the cathode of PUT 124. The resulting voltage from the discharge of capacitor 126 at the cathode of PUT 124 will appear across resistor 130 and will provide a bias voltage at the gate of SCR 122. The discharge of capacitor 126, therefore, triggers SCR 122, providing a ground at reset coil 52 through wire 30. Accordingly, when SCR 122 triggers, the voltage at reset coil 52 through wire 28 is now taken to ground and capacitor 110 discharges through reset coil 52 back to ground. Resistor 116 prevents capacitor 110 from discharging through PUT 124 because of its high resistance value. Reset coil 52 will remain momentarily energized until SCR 122 turns off, at which point the voltage across capacitor 110 will again begin to increase and the process will be repeated.

The voltage appearing at input terminals 60 and 62 also appears across capacitor 204. Upon occurrence of a fault current in overhead conductor 12, the voltage appearing at input terminals 60 and 62 through current transformer 36 increases, thereby energizing the trip circuit 200. The a.c. voltage across capacitor 204 is also presented to diode bridge 205, which rectifies the voltage signal. Capacitor 214 provides some wave shaping for the voltage signal appearing at output terminals 210 and 212 of diode bridge 205, before the voltage is divided at node 220 by resistors 216 and 218. When the voltage at node 220 reaches a certain level, approximately 7–9 volts d.c., SUS 222 breaks down and capacitor 224 discharges from the anode terminal 221 through the cathode terminal 225 of SUS 222. A voltage signal then appears at the anode of photo-diode 231 of opticoupler 230 and resistor 232 provides a voltage path so that the signal will travel through the cathode of photo-diode 231. When the current passes through the cathode of photo-diode 231, the photo-diode 231 becomes operational which causes the Darlington transistors 240 and 242 to turn on. At this point, all components of the opticoupler 230 are now energized.

In operation, opticoupler 230 isolates the trip circuit 200 and reset circuit 100 to insure that the circuit senses both a positive fault and a negative fault. When the Darlington pair transistors 240 and 242 turn on, capacitor 120 discharges through transistors 240 and 242, which connect to capacitor 120 through output terminal 236 of opticoupler 230. The Darlington pair transistors 240 and 242 conduct the discharged voltage and produce a voltage passing through output terminal 234 of opticoupler 230. In this fashion, transistors 240 and 242 trigger SCR 202 by providing a pulse through output terminal 234 to the gate of SCR 202. Once triggered, the SCR 202 then creates a path for trip coil 50 to ground. Consequently, capacitors 110 and 120 discharge through trip coil 50 to ground when SCR 202 turns on, resulting in energization of trip coil 50.

The pulse produced by the Darlington pair transistors 240 and 242 at output terminal 234 also triggers SCR 132 by providing a pulse to the gate of SCR 132. Thus, at approximately the same time that SCR 202 triggers, SCR 132 will also trigger. When SCR 132 triggers, resistor 128 provides a voltage path for capacitor 126 to discharge through the cathode of SCR 132, thereby preventing SCR 122 from turning on and preventing current flow through reset coil 52. Accordingly, SCR 132 prevents a reset from occurring during fault conditions.

Referring now to FIG. 4, the various components of electromagnet 40 are illustrated. The magnetic core 44 of electromagnet 40 consists of north and south poles of opposite polarities and is formed of magnetic material having a relatively low coercive force such as silicon manganese steel. The magnetic core 44 is constructed of one piece of magnetic material and has an overall rectangular shape. The ends 45 and 47 of the main body 55 of magnetic core 44 form a U-type channel with arms 51 and 53 extending outward in the same plane as main body 55, but perpendicular to the main body 55. The ends 57 and 59 of arms 51 and 53 form another U-type channel with arms 61 and 63 extending perpendicular to the plane of main body 55.

The coil bobbin 48 of electromagnet 40, which may be formed of a non-magnetic plastic material, includes a channel portion 49 that receives magnetic core 44. The unique structures of magnetic core 44 and coil bobbin 48 enable the core 44 and bobbin 48 to be manufactured separately and then subsequently assembled. Magnetic core 44 is secured in channel 49 of coil bobbin 48 by an adhesive material or other suitable material deposited within channel 49.

After securing magnetic core 44 in channel 49, trip coil 50 and reset coil 52 (shown in FIG. 3) are wound on bobbin 48 around core 44. As previously described, wires 28, 30, 32, and 34 (shown in FIG. 3) electrically connect trip coil 50 and reset coil 52 to the indicator circuitry mounted on circuit board 26. When trip coil 50 or reset coil 52 becomes energized, the poles of magnetic core 44 are magnetized. In this fashion, the magnetic orientation of the polarities of the poles on magnetic core 44 are electrically controlled by pulsing trip coil 50 and reset coil 52. Since magnetic core 44 is formed of a low coercive material, only a momentary energization of trip coil 50 or reset coil 52 is required to set the polarity of the poles on magnetic core 44. In practice, current through trip coil 50 and reset coil 52 will be supplied in opposite directions. Thus, the current in reset coil 52 will magnetize the polarities of the two poles on magnetic core 44 in one orientation and the current in trip coil 50 will magnetize the poles in the opposite orientation, i.e., the polarities will reverse.

Referring again to FIG. 2, disposed within spherical display 22 is a disk-shaped permanent magnet 42. Like the magnetic core 44 of electromagnet 40, the permanent magnet 42 has north and south poles of opposite polarity. The permanent magnet 42 is disposed within the spherical display 22 so that it is magnetically coupled to the electromagnet 40. Accordingly, the poles of the permanent magnet 42 are positioned adjacent to, and aligned with, the opposite polarity poles on the magnetic core 44 of the electromagnet 40, i.e., the positive pole of the electromagnet 40 aligns with the negative pole of the permanent magnet 42 and vice-versa.

The permanent magnet 42 preferably is constructed of a ceramic-type material with a high coercive force and is affixed to, and supported by, the axis shaft 23 of spherical display 22. Accordingly, the permanent magnet 42 is rotatably coupled to the spherical display 22 via axis shaft 23. In operation, therefore, permanent magnet 42 actuates rotation of spherical display 22 about shaft axis 23 when the poles of permanent magnet 42 interact with the poles of electromagnet 40. This magnetic interaction causes permanent magnet 42 of spherical display 22 to align its poles with the opposite polarity poles of electromagnet 40.

Referring now to FIG. 5, the magnetic interaction of electromagnet 40 and permanent magnet 42 is shown. Electromagnet 40 is strategically mounted in the housing 11 of faulted circuit indicator 10 such that the poles of permanent magnet 42 are in close magnetic communication with the poles of electromagnet 40. Additionally, the unique design of magnetic core 44, with arms 61 and 63 extending from the U-type channels 57 and 59, ensures maximum magnetic communication between the poles of magnetic core 44 and permanent magnet 42. This configuration allows the poles of magnetic core 44 to interact with the poles of permanent magnet 42 for the purpose of biasing spherical display 22. Because of this close proximity, the north and south poles of magnetic core 44 and permanent magnet 42 will always be properly aligned.

Referring once again to FIG. 2, the spherical display 22 of faulted circuit indicator 10 is shown. The spherical display 22 can be of any practicable size and is rotatably mounted on axis shaft 23 within housing 11. Axis shaft 23 runs perpendicular to the poles of permanent magnet 42, and its ends 29 and 31 extend beyond spherical display 22 in both directions. A pair of grooves 25 and 27 formed, such as by etching, on the inner surface 33 of cover 13 of housing 11 receive the terminal ends 29 and 31 of axis shaft 23. Plastic bearing plates 37 and 38 close grooves 25 and 27 respectively, in order to secure axis shaft 23 to housing 11.

The design described above results in one hemisphere of display 22 projecting from the cover 13 of housing 11, while the other hemisphere remains hidden within housing 11. The exposed portion of spherical display 22, therefore, is highly visible from all angles to viewers on the ground. Accordingly, the status of spherical display 22 can be easily and accurately ascertained with minimal effort. Furthermore, this design requires very low maintenance because spherical display 22 is the only moving feature. Thus, the possibility of mechanical failure is minimal.

Spherical display 22 preferably is painted with a non-magnetic reflective covering, one hemisphere being brightly-colored, typically orange, and the other hemisphere having a dull color, typically black. The reflective coating permits the status of spherical display 22 to be readily ascertained under low light conditions or at night with the use of a light. Each color indicates a different condition in the overhead conductor 12. The black hemisphere of the display is exposed when the conductor 12 is in its normal or unfaulted state. The orange hemisphere of the display, on the other hand, is exposed when the conductor 12 has operated in its fault or tripped state. One skilled in the art will recognize that each hemisphere of display 22 may have other particularly distinguishing features, such as unique patterns, instead of color.

The design described above, therefore, has several distinct advantages over the prior art. First, the reflective coating of spherical display 22 provides a high degree of visibility for the exposed hemisphere of display 22. More importantly, the three-dimensional shape of display 22, coupled with its position relative to housing 11, makes display 22 an exceptionally noticeable viewing target. In fact, this design permits spherical display 22 to be easily viewed from all angles and at great distances, resulting in more accurate readings by linemen. Such viewing access is unequalled by the prior art.

When aligned as shown in FIG. 2, spherical display 22 appears in its normal or reset state. In this position, the dull-colored hemisphere of display 22 is exposed, while the brightly-colored hemisphere remains latent. Upon occurrence of a fault condition in overhead conductor 12, spherical display 22 will rotate 180 degrees on axis shaft 23 from the normal or reset position to the tripped position. After rotation, the brightly-colored hemisphere of display 22 will be fully exposed, signaling the occurrence of a fault current in overhead conductor 12. Because of the bright color and open exposure of spherical display 22, a viewer on the ground can easily and accurately ascertain the status of overhead conductor 12 with minimal effort.

Figure 6:
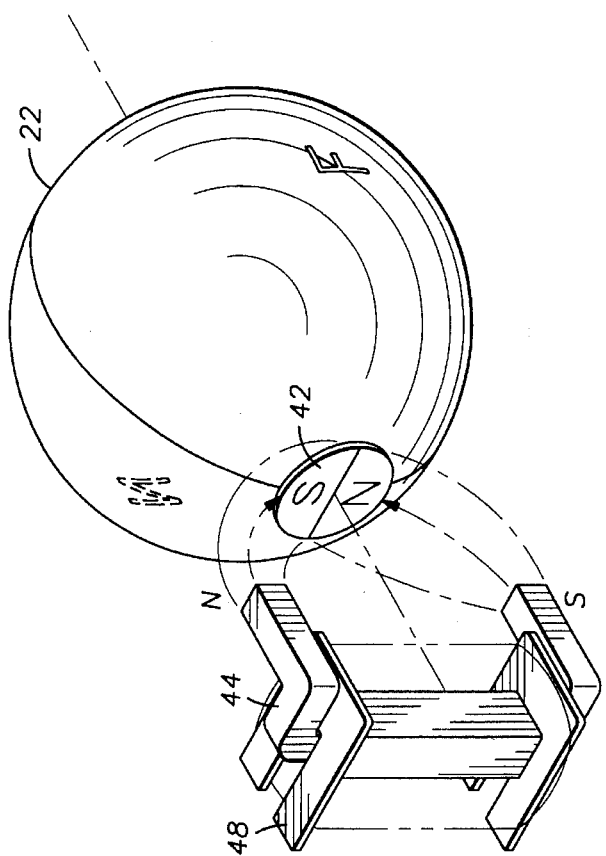
FIG. 6 is a perspective view of the principal components of the faulted circuit indicator in a reset state.

In operation, as previously described, reset circuit 100 periodically energizes reset coil 52 when capacitor 110 discharges through reset coil 52. This momentary energization creates a pulse through reset coil 52 that magnetizes the poles on magnetic core 44. Since magnetic core 44 is formed of low coercive material, only a brief energization of reset coil 52 is required to magnetize magnetic core 44. The pulse will bias the polarities of the poles on magnetic core 44 in accordance with FIG. 6. Also, as described above, under normal, no fault conditions, the process of momentarily energizing reset coil 52 will occur periodically each time SCR 122 triggers, allowing capacitor 110 to discharge through reset coil 52. In this manner, the pulse in reset coil 52 will intermittently magnetize the poles of magnetic core 44 so that the dull-colored hemisphere of indicator 22 is outwardly exposed and visible. This orientation of spherical display 22, shown in FIG. 6, will signal to the linemen that overhead conductor 12 is operating under normal, no-fault conditions.

Figure 7:
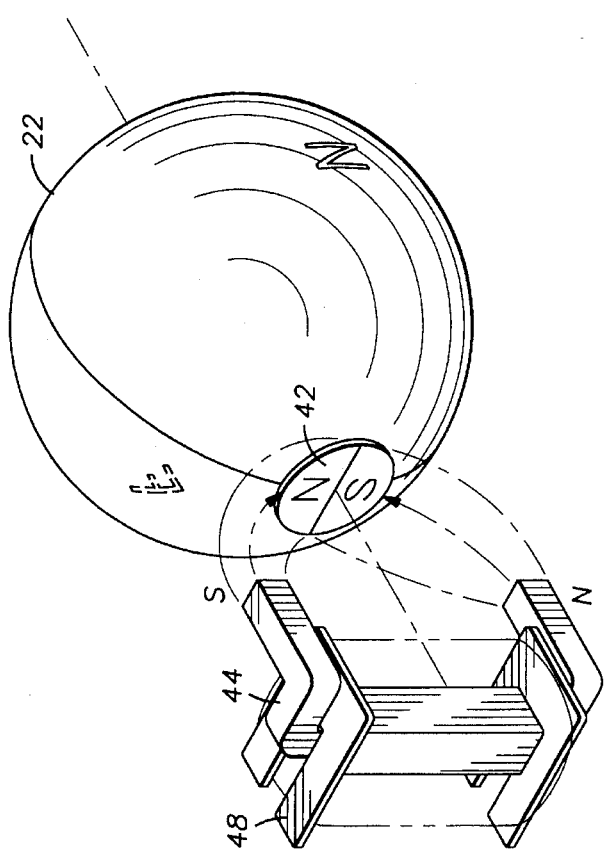
FIG. 7 is a perspective view of the principal components of the faulted circuit indicator in a tripped state.

Trip coil 50 is energized, as explained above, when SCR 202 triggers, allowing capacitors 110 and 120 to discharge through trip coil 50 to ground. This momentary energization of trip coil 50 reverses the magnetic polarities of the poles on magnetic core 44 because the current in trip coil 50 travels in the opposite direction than the current supplied to reset coil 52. As a result, the adjacent like-polarity poles of permanent magnet 42 are repelled and spherical display 22 rotates 180 degrees on its shaft axis 23 from the reset position to the tripped position. Accordingly, the poles of magnetic core 44 and permanent magnet 42 are now biased as shown in FIG. 7 and the brightly-colored hemisphere of indicator 22 is now exposed. The dramatic change in the status of spherical display 22 from a dull color to a bright color effectively alerts linemen that a fault condition is present.

Shortly after the occurrence of the fault current in overhead conductor 12, a device on the utility system, such as a fuse or a sectionalizer, will open the current in overhead conductor 12. During the fault condition, therefore, no current will flow in overhead conductor 12 and no voltage will appear at input terminals 60 and 62. Thus, voltage multiplier 150 will not receive any voltage and reset circuit 100 will assume an inoperative state. The entire circuitry will remain inactive until normal, no-fault conditions return and current is restored in overhead conductor 12.

While the fault condition exists, spherical display 22 will remain magnetically latched in the fault condition depicted in FIG. 7 because of the magnetic attraction between magnetic core 44 and permanent magnet 42. Accordingly, the status of spherical display 22 will remain unchanged until normal operating current is restored in overhead conductor 12. Shortly after the fault condition is corrected and current flow resumes in overhead conductor 12, reset coil 52 will become momentarily energized and the polarities of the poles on magnetic core 44 will once again be reversed to the orientation shown in FIG. 6. Thus, spherical display 22 will now rotate 180 degrees back to its reset position, indicating that overhead conductor 12 has been restored to normalcy.

Figure 8:
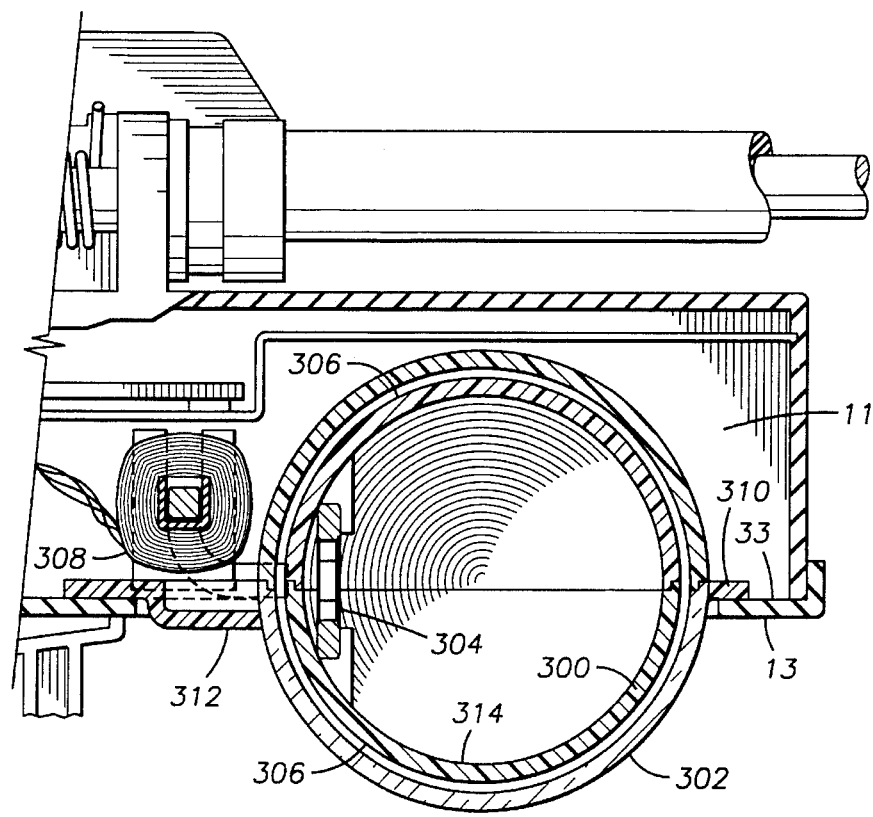
FIG. 8 is a cross-sectional side view of an alternative embodiment of the faulted circuit indicator of the present invention with a fluid-filled sphere.

Referring to FIG. 8, an alternative embodiment of the present invention is shown. In this embodiment, the display of faulted circuit indicator 10 is a fluid-suspended spherical display 300. Like the display device described above, disposed within spherical display 300 is a permanent magnet 304. Permanent magnet 304 attaches to the inner surface 314 of display 300 by fitting into a molded cavity (not shown) designed to secure the magnet. One hemisphere of display 300 is brightly-colored, while the second hemisphere is painted with a dull-colored coating, as described earlier.

A larger, outer sphere 302 completely encapsulates spherical display 300. The outer sphere 302 is formed of clear plastic or another transparent material to permit easy viewing of spherical display 300. Sphere 302 is mounted to the face 13 of housing 11 via two projections 310 and 312 that secure outer sphere 302 to housing 11. The dimensions of sphere 302 will of course depend on the size of spherical display 300. The space separating display 300 and sphere 302, i.e. the width of channel 306, provides an area for the fluid that not only acts as a fluid bearing, but also provides for considerable magnification of the inner sphere 300. The fluid acts to disperse the light such as a magnification lens would do.

Channel 306 separates display 300 and sphere 302 and is filled with a fluid solution, such as alcohol or kerosene. Spherical display 300 is sealed with air inside. The air provides display 300 with the buoyancy that permits near frictionless motion of display 300 within sphere 302. The rotation of display 300 within sphere 302 is again controlled by the use of an electromagnet 308, as explained earlier.

Figure 9:
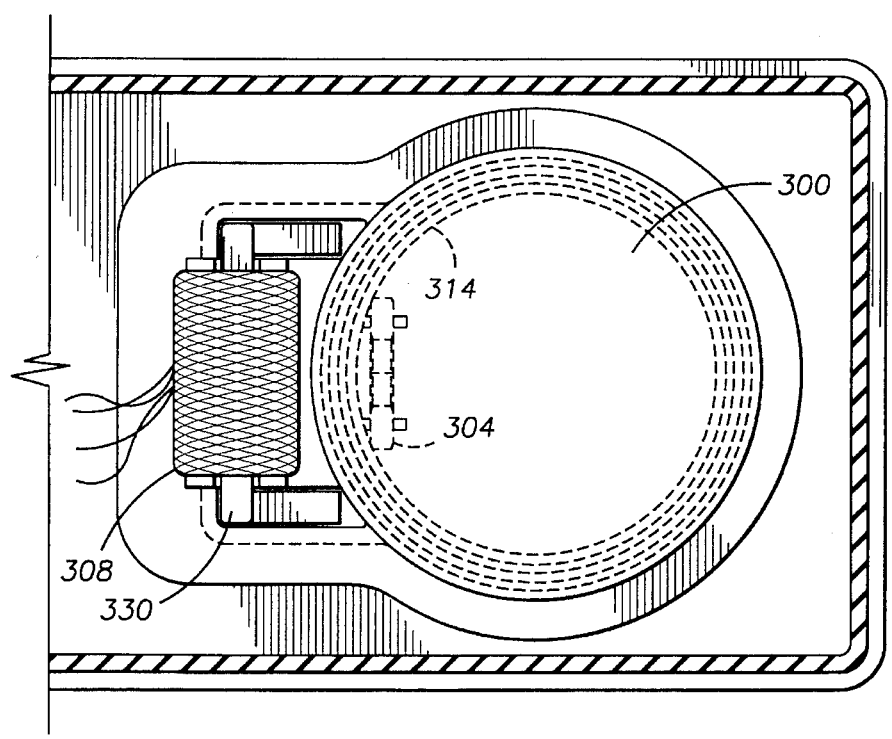
FIG. 9 is a cross-sectional front view of the alternative embodiment of FIG. 8.

The magnetic attraction between permanent magnet 304 and electromagnet 308 is shown in FIG. 9. As previously described, electromagnet 308 is positioned within housing 11 in close proximity to permanent magnet 304. This design allows the poles of permanent magnet 304 to be in close magnetic communication with the poles of electromagnet 308. Since the permanent magnet 304 is physically attached to the inner surface 314 of spherical display 300, permanent magnet 304 is also rotatably coupled to display 300. Accordingly, the rotation of permanent magnet 304 caused by the magnetic field emitted from electromagnet 308 will also result in the rotation of spherical display 300.

The operation of the this embodiment is very similar to the operation of the preferred embodiment. The pulse created in reset coil 52 (shown in FIG. 3) will magnetize the magnetic core 330 of electromagnet 308 in one orientation and trip coil 50 (shown in FIG. 3) will magnetize the magnetic core 330 in the opposite orientation. Thus, when the polarities of the poles on magnetic core 330 are reversed, as described earlier, spherical display 300 will rotate 180 degrees. Because the fluid and buoyancy of display 300 allow near frictionless rotation, this design may require lesser external forces to rotate display 300. Therefore, this design may operate with even less power than the preferred embodiment.

Still another alternative embodiment is illustrated in FIG. 10. This embodiment consists of a spherical display 400 rotatably mounted on axis shaft 402, as described in the preferred embodiment. Also as described earlier, permanent magnet 404 is affixed to, and supported by, the axis shaft 402 of spherical display 400. Accordingly, the permanent magnet 404 is rotatably coupled to the spherical display 400 via axis shaft 402. In this design, however, permanent magnet 404 is located external to spherical display 400, rather than being disposed within spherical indicator 400.

Because permanent magnet 404 is located outside spherical display 400, permanent magnet 404 can be placed on shaft axis 402 in very close proximity to electromagnet 406. This particular arrangement enhances and strengthens the magnetic communication between permanent magnet 404 and electromagnet 406. Thus, rotation of spherical display 400 can be controlled much easier.

Yet another alternative embodiment is illustrated in FIG. 11. In contrast to the previous designs that utilize a spherical display, the display device of this embodiment is a cylindrical display 450. Cylindrical display 450 functions and operates in precisely the same manner as the preferred embodiment described earlier.

In the preferred embodiment described above, the following electrical components are suitable for use in the circuitry depicted in FIG. 3:

| Component | Reference No. | Manufacturer | Description |
| --- | --- | --- | --- |
| Resistor | 104 | Mepco/Centralab | 47K, ½ W |
| Zener Diode | 106 | Motorola | Mfg's Part No. 1N4709 |
| Zener Diode | 108 | Motorola | Mfg's Part No. 1N4754 |
| Capacitor | 110, 120 | Mallory | 15 uF, 50 V |
| Zener Diode | 112 | Motorola | 39 V, Mfg's Part No. 1N4716 |
| Resistor | 114, 116 | Mepco/Centralab | 4.75M |
| Diode | 118 | Motorola | Mfg's part No. 1N4004 |
| Silicon-Controlled Rectifier | 122 | Motorola | MCR22-6 |
| Programmable Uni-junction Transistor | 124 | Motorola | 2N6028 |
| Capacitor | 126 | Mepco/Centralab | .022 uF |
| Resistor | 128, 226 | Mepco/Centralab | 100K |
| Resistor | 130 | Mepco/Centralab | 1M |
| Silicon-Controlled Rectifier | 132, 202 | Motorola | MCR22-6 |
| Capacitor | 152–159 | Mallory | 1 uF, 250 V |
| Diode | 160–167 | Motorola | Mfg's Part No. 1N4004 |
| Capacitor | 204, 214 | Nichicon | .1 uF, 400 V |
| Diode | 206–209 | Motorola | 1N4004 |
| Resistor | 216 | Mepco/Centralab | 470K |
| Resistor | 218 | Mepco/Centralab | 22K |
| Silicon Unilateral Switch | 222 | Harris | Mfg's Part No. 2N4999 |
| Capacitor | 224 | Mepco/Centralab | .1 uF, 50 V |
| Photo-diode | 231 | Motorola | MOC8021* |
| Resistor | 232 | Mepco/Centralab | 330 |
| Resistor | 238 | Mepco/Centralab | 1K |
| Darlington Transistors | 240, 242 | Motorola | MOC8021* |

*All parts are contained in one package as depicted by opticoupler 230.

While a preferred embodiment of the invention has been shown and described, modifications thereof can be made by one skilled in the art without departing from the spirit of the invention.

What is claimed is:

1. An indicator for indicating either a normal or fault current through a conductor, comprising:

a housing;

an electromagnet connected to said housing and having a normal coil and a trip coil;

a current monitor for sensing the current through the conductor, said current monitor producing an induced current signal proportional to the current in the conductor;

a trip circuit connected to said current monitor for receiving said induced current signal, said trip circuit including:

detection circuitry for detecting the fault current in the conductor, said detection circuitry electrically connected to said trip coil;

wherein said detection circuitry produces a first signal when the fault current is detected in the conductor, and wherein, said trip coil receives said first signal;

a reset circuit connected to said current monitor for receiving said induced current signal and connected to said detection circuitry, said reset circuit including:

activation circuitry for activating said normal coil, said activation circuitry electrically connected to said normal coil and producing a second signal upon receipt of said induced current;

wherein said normal coil is activated upon receipt of said second signal, and wherein said activation circuitry receives said first signal from said detection circuitry and, in response to said first signal, said activation circuitry is deactivated;

said normal coil producing a first polarity of said electromagnet upon receipt of the second signal from said activation circuitry, and said trip coil producing a second polarity of said electromagnet upon receipt of the first signal from said detection circuitry;

a permanent magnet rotatably mounted adjacent said electromagnet such that said permanent magnet aligns with the polarity of said electromagnet;

a three-dimensional display having an external surface area and being coupled to said permanent magnet, said display having a normal side formed by a first half of said surface area and a trip side formed by a second half of said surface area; and said permanent magnet and display being positioned during said first polarity so that said first half of said surface area of said normal side is visible and more than fifty percent of said first half of said surface area of said normal side projects outward from said housing, and being positioned during said second polarity so that said second half of said surface area of said trip side is visible and more than fifty percent of said second half of said surface area of said trip side projects outward from said housing.

2. The indicator of claim 1 wherein said current monitor is a current transformer.

3. The indicator of claim 2 further comprising a voltage multiplier network for increasing the voltage of the induced current signal received from said current transformer.

4. The indicator of claim 1 wherein said electromagnet includes a one piece magnetic core having a main body with a first end and a second end, said first and said second ends having a set of arms extending from said main body to ensure magnetic communication between said permanent magnet and said electromagnet.

5. The indicator of claim 1 wherein said permanent magnet is disposed within said display.

6. The indicator of claim 1 wherein said permanent magnet is external to said display.

7. The indicator of claim 1 wherein said display comprises a sphere.

8. The indicator of claim 1 wherein said display comprises a cylinder.

9. The indicator of claim 1 wherein said normal side of said display is a dull color.

10. The indicator of claim 9, wherein said dull color is black.

11. The indicator of claim 1 wherein said trip side of said display is a bright color.

12. The indicator of claim 11 wherein said bright color is orange.

13. A faulted circuit indicator for indicating the occurrence of a fault current in an electrical conductor, comprising:

a housing;

a three-dimensional display rotatably mounted on said housing, said display including at least a first side of a first color and a second side of a second color, said first side indicating a reset condition and approximately all of said first side being exposed and projecting outward from said housing when said second side is disposed within said housing, and said second side indicating a fault condition and approximately all of said second side being exposed and projecting outward from said housing when said first side is disposed within said housing;

an electromagnet mounted in said housing comprising a reset coil, a trip coil, and a magnetic core assembly, said reset and trip coils being wound around said magnetic core, said magnetic core having a south pole and a north pole;

a permanent magnet having a south pole and a north pole, said permanent magnet being rotatably coupled to said display and being magnetically coupled to said magnetic core of said electromagnet so that said south pole of said permanent magnet aligns with said north pole of said magnetic core and said north pole of said permanent magnet aligns with said south pole of said magnetic core; and a trip circuit connected to said trip coil and including detection circuitry for detecting the fault current in the conductor, said detection circuitry electrically connected to said trip coil and producing a first pulse when the fault current is detected in the conductor, and said trip coil receiving said first pulse;

a reset circuit connected to said reset coil and said detection circuitry, said reset circuit including activation circuitry for activating said reset coil, Said activation circuitry being electrically connected to said reset coil and producing a second pulse, said reset coil being activated upon receipt of said second pulse, and said activation circuitry receiving said first pulse from said detection circuitry and, in response to said first pulse, said activation circuitry being deactivated;

said second pulse in said reset coil magnetically polarizing said poles of said magnetic core in one orientation so that approximately all of said first side of said display is exposed and projects outward from said housing to indicate said reset condition and said first pulse in said trip coil magnetically polarizing said poles of said magnetic core in a second orientation so that approximately all of said second side of said display is exposed and projects outward from said housing to indicate said fault condition.

14. The faulted circuit indicator of claim 13 wherein said magnetic core has a main body with a first end and a second end, said first and said second ends having a set of arms extending from said main body.

15. The faulted circuit indicator of claim 13 wherein said permanent magnet is disposed within said display.

16. The faulted circuit indicator of claim 13 wherein said permanent magnet is external to said display.

17. The faulted circuit indicator of claim 13 wherein said display comprises a sphere, said first side having a dull color and said second side having a bright color.

18. The faulted circuit indicator of claim 13 wherein said display comprises a cylinder, said first side having a dull color and said second side having a bright color.

19. A faulted circuit indicator for indicating the occurrence of a fault current in an electrical conductor, comprising:

a housing;

a fluid filled casing affixed to said housing;

a display suspended in said fluid filled casing, said display including at least two sides with the first side having a first color and the second side having a second color;

an electromagnet comprising a trip coil, a reset coil, and a magnetic core assembly, said magnetic core having a south pole and a north pole;

a permanent magnet having a south pole and a north pole, said permanent magnet being rotatably coupled to said display and magnetically coupled to said magnetic core of said electromagnet so that said south pole of said permanent magnet aligns with said north pole of said magnetic core and said north pole of said permanent magnet aligns with said south pole of said magnetic core; and an energizing means electrically connected to said reset coil and said trip coil, said energizing means periodically producing a first electrical pulse in said reset coil when a no-fault current flows through the conductor and producing a second electrical pulse in said trip coil when a fault current flows through the conductor, said first pulse in said reset coil magnetically polarizing said poles of said magnetic core in one orientation so that said first side of said display is visible and said second pulse in said trip coil magnetically polarizing said poles of said magnetic core in a second orientation so that said second side of said display is visible.

20. The faulted circuit indicator of claim 19 wherein said display is a sphere.

21. The faulted circuit indicator of claim 20 wherein said casing is a larger sphere encapsulating said sphere.

22. The faulted circuit indicator of claim 20 wherein said sphere is filled with air.

23. The faulted circuit indicator of claim 19 wherein the fluid in said fluid filled casing is alcohol.

24. The faulted circuit indicator of claim 19 wherein the fluid in said fluid filled casing is kerosene.

25. The faulted circuit indicator of claim 19 wherein said magnetic core has a main body with a first end and a second end, said first and said second ends having a set of arms extending from said main body.

26. The faulted circuit indicator of claim 19 wherein said first side of said display indicates a reset condition and is a dull color.

27. The faulted circuit indicator of claim 26 wherein said dull color is black.

28. The faulted circuit indicator of claim 19 wherein said second side of said display indicates a fault condition and is a bright color.

29. The faulted circuit indicator of claim 28 wherein said bright color is orange.

30. The faulted circuit indicator of claim 19 wherein said display projects outward from said housing so that either approximately all of said first side or approximately all of said second side is visible.

31. A faulted circuit indicator for indicating the presence of a fault in an electrical conductor, comprising:

a current monitor (36) for sensing the current through the conductor;

a voltage multiplier circuit (150) connected to said electrical conductor (12) via said current monitor, said voltage multiplier circuit receiving electrical current from said conductor, and in response thereto, providing an output signal with an increased voltage;

a trip circuit (200) connected to said electrical conductor (12) via said current monitor, said trip circuit including;

a trip coil (50) electrically connected to said voltage multiplier (150) for receiving said output signal from said voltage multiplier (150); and detection circuitry for detecting a fault condition in said electrical conductor (12), said detection circuitry electrically connected to said trip coil (50);

wherein said detection circuitry provides a fault signal when a fault is detected in said electrical conductor (12), and said fault signal activates said trip coil;

a reset circuit (100) connected to said voltage multiplier (150) and to said detection circuitry, said reset circuit including;

a reset coil (52); and activation circuitry for activating said reset coil; wherein said activation circuitry receives the output signal from said voltage multiplier (150) to energize the reset coil, and wherein said activation circuitry also receives the fault signal from said detection circuitry and, in response to the fault signal, said activation circuitry is deactivated; and a three-dimensional display coupled to said trip coil and said reset coil, said display indicating the presence of a fault in the conductor when said fault signal activates said trip coil.

32. A faulted circuit indicator for indicating the presence of a fault in an electrical conductor, comprising:

a current monitor (36) for sensing the current through the conductor;

a voltage multiplier circuit (150) connected to said electrical conductor (12) via said current monitor, said voltage multiplier circuit receiving electrical current from said conductor, and in response thereto, providing an output signal with an increased voltage;

a trip circuit (200) connected to said electrical conductor (12) via said current monitor, said trip circuit including;

a trip coil (50) electrically connected to said voltage multiplier (150) for receiving said output signal from said voltage multiplier (150); and detection circuitry for detecting a fault condition in said electrical conductor (12), said detection circuitry electrically connected to said trip coil (50);

wherein said detection circuitry provides a fault signal when a fault is detected in said electrical conductor (12), and said trip coil is energized by the output signal from said voltage multiplier when said fault signal activates said trip coil;

a reset circuit (100) connected to said voltage multiplier (150) and to said detection circuitry, said reset circuit including;

a reset coil (52); and activation circuitry for activating said reset coil;

wherein said activation circuitry receives the output signal from said voltage multiplier (150) to energize the reset coil, and wherein said activation circuitry also receives the fault signal from said detection circuitry and, in response to the fault signal, said activation circuitry is deactivated; and a three-dimensional display coupled to said trip coil and said reset coil, said display indicating the presence of a fault in the conductor when said fault signal activates said trip coil.

33. An indicator as in claim 32, wherein said detection circuitry comprises;

a first switch (222) and a second switch (202);

wherein said first switch (222) is activated when the voltage on said electrical conductor exceeds a predetermined maximum voltage.

34. An indicator as in claim 33, wherein said first switch (222), when actuated, turns on said second switch (202), causing the output signal from said voltage multiplier (150) to operate the trip coil.

35. An indicator as in claim 33, wherein said predetermined maximum voltage is determined by a voltage divider (216, 218) in said detection circuitry.

36. An indicator as in claim 32, wherein said activation circuitry comprises:

a first switch (122) and a second switch (132); and wherein said first switch (122) turns on periodically to permit the output signal from the voltage multiplier (150) to reset the reset coil.

37. An indicator as in claim 36, wherein said activation circuitry further comprises:

a zener diode (106) for periodically turning on said first switch (122).

38. An indicator as in claim 37, wherein said second switch (132) is actuated in response to a fault signal from said detection circuitry, causing the activation circuitry to be deactivated.

\* \* \* \* \*